United States Patent
Wang et al.

(10) Patent No.: US 8,295,798 B2
(45) Date of Patent: Oct. 23, 2012

(54) TUNABLE FILTERS WITH LOWER RESIDUAL SIDEBAND

(75) Inventors: Cheng-Han Wang, San Jose, CA (US); Roger Brockenbrough, Los Gatos, CA (US); Tzu-wang Pan, Saratoga, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 830 days.

(21) Appl. No.: 12/254,129

(22) Filed: Oct. 20, 2008

(65) Prior Publication Data

US 2010/0099372 A1    Apr. 22, 2010

(51) Int. Cl.
*H04B 1/06* (2006.01)
(52) U.S. Cl. .................................. 455/266
(58) Field of Classification Search .................. None
See application file for complete search history.

(56) References Cited

U.S. PATENT DOCUMENTS

| | | | |
|---|---|---|---|
| 6,219,376 B1 * | 4/2001 | Zhodzishsky et al. | 375/148 |
| 6,915,114 B2 * | 7/2005 | Khorram | 455/67.14 |
| 6,978,125 B2 * | 12/2005 | Lindell et al. | 455/183.1 |
| 7,970,364 B2 * | 6/2011 | Mayer et al. | 455/127.2 |
| 7,994,870 B2 * | 8/2011 | Wang et al. | 331/172 |
| 2006/0267698 A1 * | 11/2006 | Erdogan et al. | 331/17 |

FOREIGN PATENT DOCUMENTS

WO    WO2006128075    11/2006

OTHER PUBLICATIONS

He X et al: "A 2.5-GHz Low-Power, High Dynamic Range, Self-Tuned Q-Enhanced LC Filter in SOI" IEEE Journal of Solid-State Circuits, IEEE Service Center, Piscataway, NJ, US, vol. 40, No. 8, Aug. 1, 2005, pp. 1618-1628, XP011136746 ISSN: 0018-9200 figure 8 Chapter IV.
International Search Report—PCT/US2009/061385—International Search Authority—European Patent Office, Apr. 6, 2010.
Shouhei Kousai et al: "A novel quality factor tuning scheme for active-RC filters" 33rd European Solid State Circuits Conference, 2007. ESSCIRC, IEEE, PI, Sep. 1, 2007, pp. 496-499, XP031202262 ISBN: 978-1-4244-1125-2 figures 8-10 Chapter IV.
Xin He; Kuhn, W.B.; "A 2.5-GHz low-power, high dynamic range, self-tuned Q-enhanced LC filter in SOI" Solid-State Circuits, IEEE Journal of; vol. 40, Issue: 8 Digital Object Identifier: 10.1109/JSSC. 2005.852043; Publication Year: 2005 , pp. 1618-1628.

* cited by examiner

*Primary Examiner* — Lincoln Donovan
*Assistant Examiner* — Khareem E Almo
(74) *Attorney, Agent, or Firm* — Ramin Mobarhan

(57) ABSTRACT

An apparatus includes first and second filters and a bandwidth control circuit. The first filter operates as part of a first oscillator in a first mode and filters a first input signal and provides a first output signal in a second mode. The second filter operates as part of a second oscillator in the first mode and filters a second input signal and provides a second output signal in the second mode. The bandwidth control circuit adjusts the bandwidth of the first and second filters in the first mode, e.g., adjusts the oscillation frequency of each oscillator to obtain a target bandwidth for an associated filter. The apparatus may further include first and second gain control circuits. Each gain control circuit may vary the amplitude of an oscillator signal from an associated oscillator and/or set a gain of an associated filter in the first mode.

26 Claims, 11 Drawing Sheets

TUNABLE FILTERS WITH LOWER RESIDUAL SIDEBAND

BACKGROUND

I. Field

The present disclosure relates generally to electronics, and more specifically to tunable filters.

II. Background

Filters are commonly used in various electronics devices to pass desired signal components and attenuate undesired signal components. Different types of filters are available for different applications. For example, a wireless communication device such as a cellular phone may include a receiver and a transmitter for bi-directional communication. The receiver and transmitter may each utilize bandpass and lowpass filters.

A filter may be designed to have a particular gain and a particular bandwidth. However, the gain and bandwidth of the filter may deviate from the desired values due to various factors such as component variations. It is desirable to obtain the desired gain and bandwidth for the filter in order to achieve good performance.

DETAILED DESCRIPTION

The word "exemplary" is used herein to mean "serving as an example, instance, or illustration." Any design described herein as "exemplary" is not necessarily to be construed as preferred or advantageous over other designs.

Tunable filters with adjustable bandwidth and gain are described herein. The tunable filters may be used for various electronics devices such as wireless communication devices, cellular phones, personal digital assistants (PDAs), handheld devices, wireless modems, laptop computers, cordless phones, Bluetooth devices, etc. For clarity, the use of the tunable filters for a wireless communication device is described below.

Figure 1:
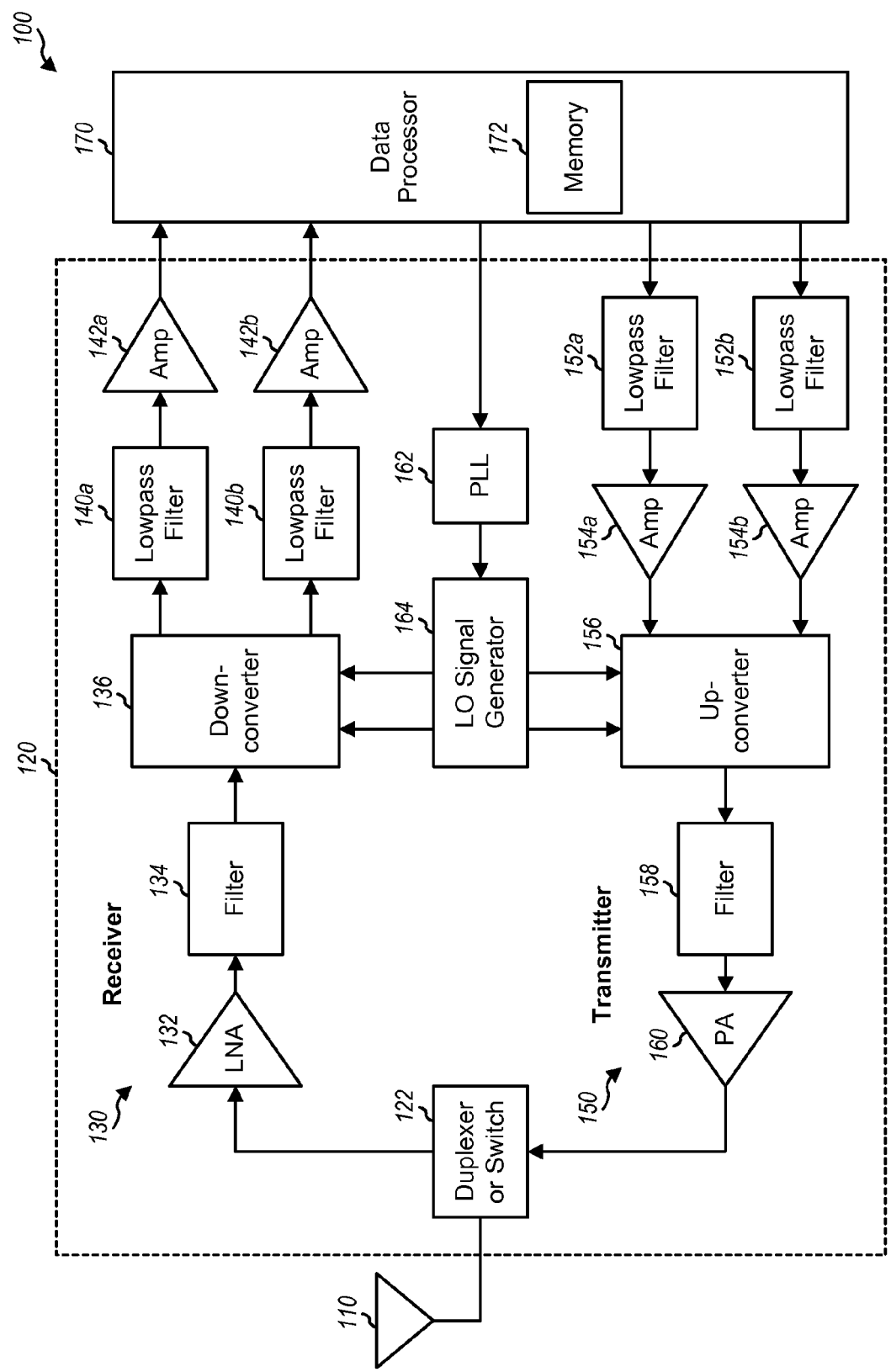
FIG. 1 shows a block diagram of a wireless communication device.

FIG. 1 shows a block diagram of a wireless communication device 100, which may be a cellular phone or some other device. In the exemplary design shown in FIG. 1, wireless device 100 includes a transceiver 120 and a data processor 170 having a memory 172 to store data and program codes. Transceiver 120 includes a receiver 130 and a transmitter 150 that support bi-directional communication. In general, wireless device 100 may include any number of receivers and any number of transmitters for any number of communication systems and frequency bands.

A receiver or a transmitter may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the exemplary design shown in FIG. 1, receiver 130 and transmitter 150 are implemented with the direct-conversion architecture.

In the receive path, an antenna 110 receives signals transmitted by base stations and/or other transmitter stations and provides a received RF signal, which is routed through a duplexer or switch 122 and provided to receiver 130. Within receiver 130, the received RF signal is amplified by a low noise amplifier (LNA) 132 and filtered by a filter 134 to obtain an RF input signal. A downconverter 136 downconverts the RF input signal with inphase and quadrature receive local oscillator signals (I and Q RX LO signals) from an LO signal generator 164 and provides I and Q downconverted signals. Lowpass filters 140a and 140b filter the I and Q downconverted signals, respectively, to remove images and out-of-band noise and provide I and Q filtered signals. Amplifiers (Amp) 142a and 142b amplify the I and Q filtered signals, respectively, to obtain the desired signal amplitude and provide I and Q input baseband signals to data processor 170.

In the transmit path, data processor 170 processes data to be transmitted and provides I and Q output baseband signals to transmitter 150. Within transmitter 150, lowpass filters 152a and 152b filter the I and Q output baseband signals, respectively, to remove images caused by the prior digital-to-analog conversion. Amplifiers 154a and 154b amplify the signals from lowpass filters 152a and 152b, respectively, and provide I and Q amplified signals. An upconverter 156 upconverts the I and Q amplified signals with I and Q transmit (TX) LO signals from LO signal generator 164 and provides an upconverted signal. A filter 158 filters the upconverted signal to remove images caused by the frequency upconversion as well as noise in a receive frequency band. A power amplifier (PA) 160 amplifies the signal from filter 158 to obtain the desired output power level and provides a transmit RF signal. The transmit RF signal is routed through duplexer or switch 122 and transmitted via antenna 110.

LO signal generator 164 generates the I and Q RX LO signals used for frequency downconversion as well as the I and Q TX LO signals used for frequency upconversion. A phase locked loop (PLL) 162 receives timing information from data processor 170 and generates control signals used to adjust the frequency and/or phase of the TX LO signals and the RX LO signals from LO signal generator 164.

FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

In the exemplary design shown in FIG. 1, receiver 130 performs quadrature downconversion to obtain I and Q downconverted signals. The I downconverted signal is processed by lowpass filter 140a and amplifier 142a in the I signal path. The Q downconverted signal is processed by lowpass filter 140b and amplifier 142b in the Q signal path. Ideally, the frequency response of lowpass filter 140a should match the frequency response of lowpass filter 140b. Furthermore, the gain of lowpass filter 140a and amplifier 142a in the I signal path should match the gain of lowpass filter 140b and amplifier 142b in the Q signal path. Mismatches in the overall phase and gain of the I and Q signal paths result in residual sideband (RSB), which is distortion that may degrade performance.

Residual sideband for quadrature downconversion may be expressed as:

$$RSB(f) = -10 \cdot \log_{10}\left(\left(\left(\frac{\Delta\theta(f) \cdot \pi}{180}\right)^2 + \left(10^{\frac{\Delta gain(f)}{20}} - 1\right)^2\right)/4\right), \quad \text{Eq (1)}$$

where RSB(f) is residual sideband at frequency f,

Δθ(f) is phase mismatch between the I and Q signal paths at frequency f, and

Δgain(f) is gain mismatch between the I and Q signal paths at frequency f.

As shown in equation (1), the cause of residual sideband may be decoupled into two parts, which are phase mismatch and gain mismatch between the I and Q signal paths. Residual sideband may be reduced by minimizing phase and gain mismatches between the I and Q signal paths.

Tunable filters may be used for lowpass filters 140a and 140b in the I and Q signal paths of receiver 130 in order to reduce residual sideband. Tunable filters may also be used for lowpass filters 152a and 152b in the I and Q signal paths of transmitter 150. For clarity, much of the description below is for use of tunable filters for lowpass filters 140a and 140b in the I and Q signal paths of receiver 130. In the following description, a numerical reference with a letter (e.g., "140a") refers to a specific element. A numerical reference without a letter (e.g., "140") may refer to any instance of that numerical reference (e.g., "140a" or "140b") or all instances of that numerical reference (e.g., "140a" and "140b").

Figure 2A:
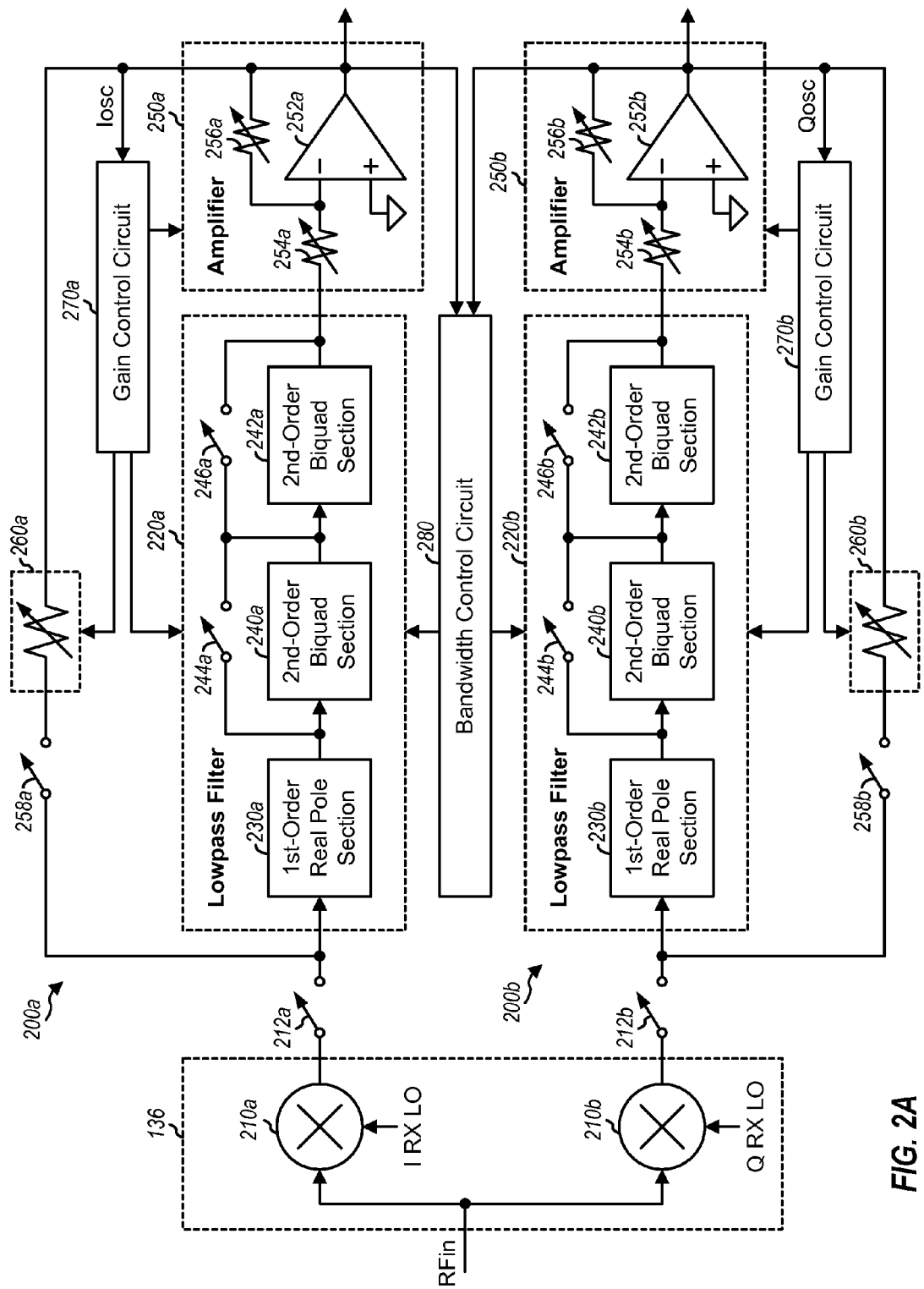
FIG. 2A shows a block diagram of tunable filters for I and Q signal paths.

FIG. 2A shows a block diagram of an exemplary design of tunable filters 200a and 200b for the I and Q signal paths, respectively. Each tunable filter 200 includes a lowpass filter 220, an amplifier 250, and other circuitry used for gain and bandwidth tuning. Lowpass filter 220 and amplifier 250 may both be used for lowpass filter 140a or 140b in FIG. 1. Alternatively, lowpass filter 220 and amplifier 250 may be used for lowpass filter 140 and amplifier 142, respectively, in one signal path. Each tunable filter 200 may include amplifier 250 (as shown in FIG. 2A) or may omit amplifier 250.

Within downconverter 136, mixers 210a and 210b receive and downconvert the RF input signal with the I and Q RX LO signals and provide the I and Q downconverted signals, respectively. For the I signal path, a switch 212a is coupled between the output of mixer 210a and the input of lowpass filter 220a. A switch 258a and a variable resistor 260a are coupled in series, and the combination is coupled between the input of lowpass filter 220a and the output of amplifier 250a.

In the exemplary design shown in FIG. 2A, lowpass filter 220a includes three filter sections 230a, 240a and 242a coupled in series. First-order real pole section 230a has its input coupled to switch 212a and its output coupled to the input of second-order biquad section 240a. Biquad section 240a has its output coupled to the input of second-order biquad section 242a, which has its output coupled to the input of amplifier 250a. Each biquad section includes two complex poles designed to obtain the desired frequency response for that biquad section. A switch 244a is coupled across biquad section 240a, and a switch 246a is coupled across biquad section 242a. Lowpass filter 220a can implement a 5-th order lowpass filter when all three filter sections 230a, 240a and 242a are enabled. Lowpass filter 220a can also implement (i) a first order lowpass filter when only first-order section 230a is enabled or (ii) a third-order lowpass filter when first-order section 230a and either biquad section 240a or 242a are enabled.

In the exemplary design shown in FIG. 2A, amplifier 250a is a programmable gain amplifier and includes an operational amplifier (op-amp) 252a and variable resistors 254a and 256a. Resistor 254a is coupled between the output of lowpass filter 220a and an inverting input of op-amp 252a. Resistor 256a is coupled between the inverting input and the output of op-amp 252a. Amplifier 250a may also be a variable gain amplifier (VGA).

For the Q signal path, lowpass filter 220b, amplifier 250b, switches 212b and 258b, and variable resistor 260b are coupled in the same manner as lowpass filter 220a, amplifier 250a, switches 212a and 258a, and variable resistor 260a in the I signal path.

A gain control circuit 270a receives an I output signal (Iosc) from amplifier 250a and generates gain control for variable resistor 260a, lowpass filter 220a, and/or amplifier 250a in the I signal path. A gain control circuit 270b receives a Q output signal (Qosc) from amplifier 250b and generates gain control for variable resistor 260b, lowpass filter 220b, and/or amplifier 250b in the Q signal path. A bandwidth control circuit 280 receives the I output signal from amplifier 250a and generates I bandwidth control for lowpass filter 220a. Bandwidth control circuit 280 also receives the Q output signal from amplifier 250b and generates Q bandwidth control for lowpass filter 220b.

Figure 2B:
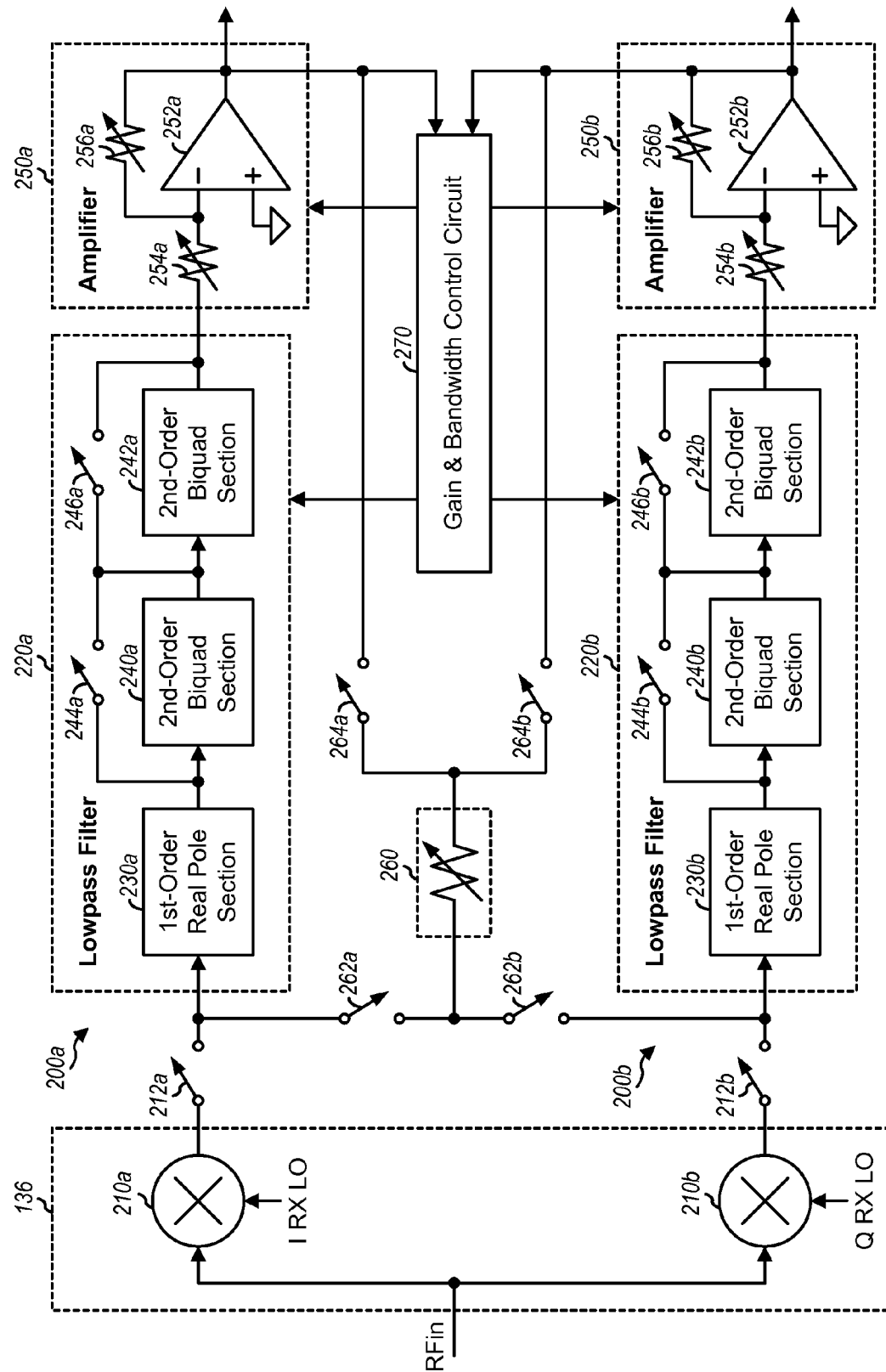
FIG. 2B shows another block diagram of tunable filters for I and Q signal paths.

FIG. 2B shows a block diagram of another exemplary design of tunable filters 200a and 200b for the I and Q signal paths, respectively. In this exemplary design, a single resistor 260 is used for both tunable filters 200a and 200b. Switches 262a and 264a are coupled between two ends of resistor 260 and the input and output, respectively, of tunable filter 200a. Switches 262b and 264b are coupled between the two ends of resistor 260 and the input and output, respectively, of tunable filter 200b. A gain and bandwidth control unit 270 receives the I output signal from tunable filter 200a and the Q output signal from tunable filter 200b. Unit 270 generates gain control to adjust the gains of the I and Q tunable filters and bandwidth control to adjust the bandwidth of the I and Q tunable filters.

FIGS. 2A and 2B show an exemplary design of lowpass filters 220a and 220b. In general, lowpass filters 220a and 220b may each have any order and include any number of filter sections. Each filter section may have any order (e.g., first, second or higher order) and may be implemented with various designs. Lowpass filters 220a and 220b may also implement any type of filter such as Butterworth, Bessel, Chebychev, elliptical, etc. The design of lowpass filters 220a and 220b may be dependent on filtering requirements of an application in which the lowpass filters are used. Lowpass filters 220a and 220b may also be replaced with bandpass filters, highpass filters, notch filters, or some other type of filters.

Figure 3:
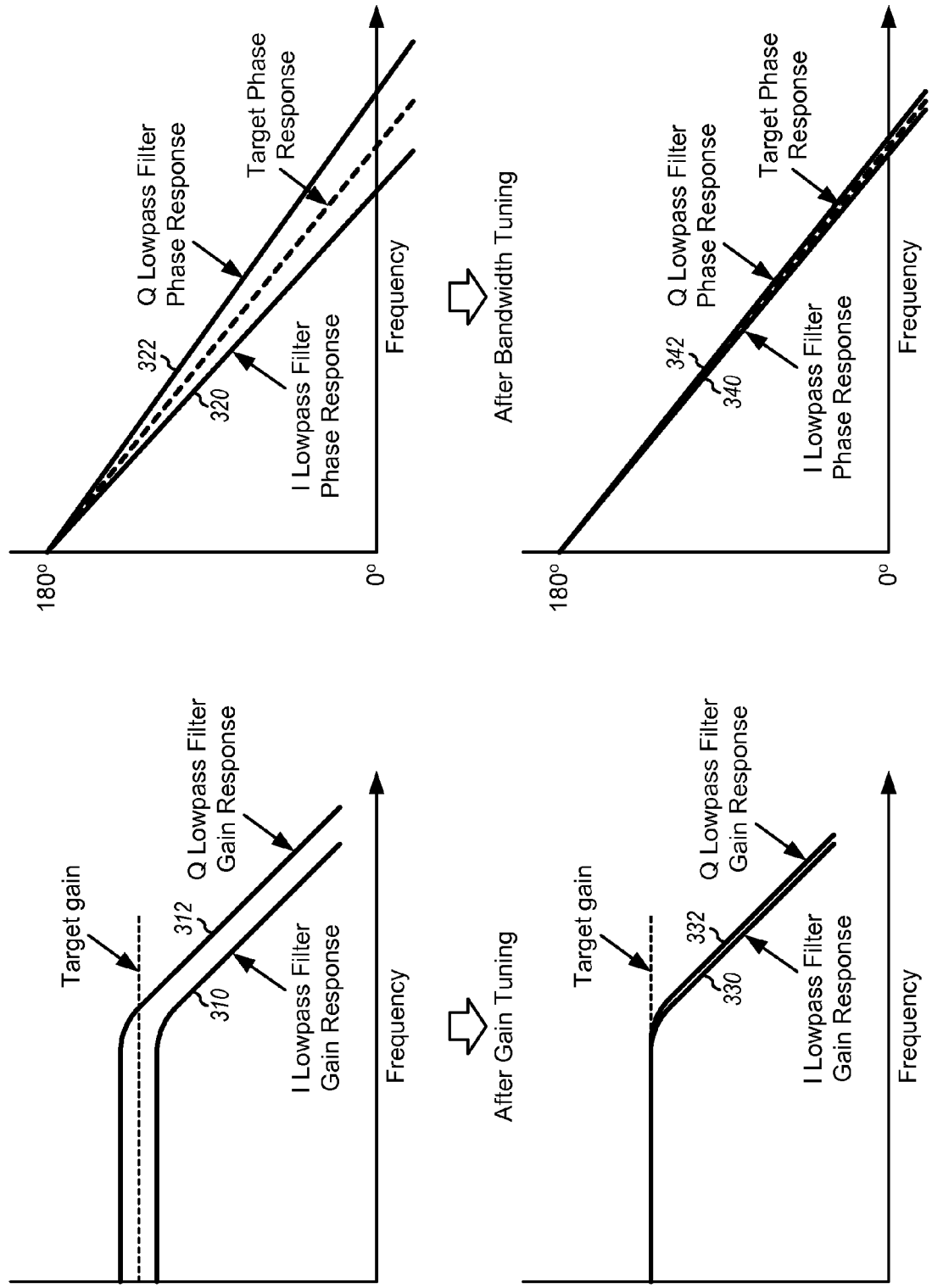
FIG. 3 shows gain and phase responses of the I and Q lowpass filters.

FIG. 3 shows example gain and phase responses of the I and Q lowpass filters. The gain responses of the I and Q lowpass filters versus frequency are shown by plots 310 and 312, respectively, and may deviate from a target gain. The phase responses of the I and Q lowpass filters versus frequency are shown by plots 320 and 322, respectively, and may deviate from a target phase response.

Gain tuning/adjustment may be performed to adjust the gains of the I and Q lowpass filters to obtain the target gain for each lowpass filter. The gain tuning may attempt to match the gain of the I lowpass filter to the gain of the Q lowpass filter. The gain responses of the I and Q lowpass filters after gain tuning are shown by plots 330 and 332, respectively.

Bandwidth tuning/adjustment may also be performed to adjust the bandwidth of the I and Q lowpass filters to obtain the target phase response for each lowpass filter. The bandwidth tuning may attempt to match the bandwidth of the I lowpass filter to the bandwidth of the Q lowpass filter. The phase responses of the I and Q lowpass filters after bandwidth tuning are shown by plots 340 and 342, respectively.

As shown in FIG. 3, by performing gain and bandwidth tuning, the gain and phase responses of the I lowpass filter may better match the gain and phase responses of the Q lowpass filter. The improved gain and phase matching may result in smaller gain mismatch and smaller phase mismatch, which may then lower RSB, as shown by equation (1). The gain and bandwidth tuning may be performed by adjusting variable resistors and variable capacitors within lowpass filters 220a and 220b and possibly amplifiers 250a and 250b.

Figure 4A:
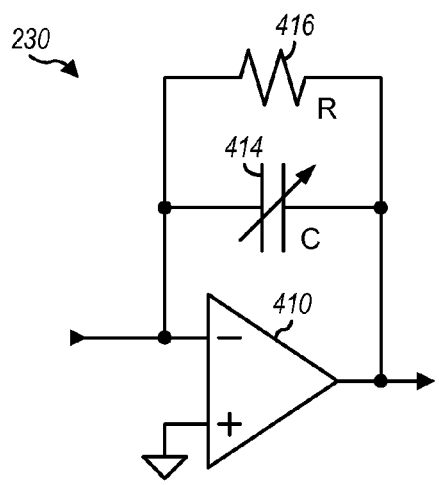
FIG. 4A shows a schematic diagram of a first-order real pole section.

FIG. 4A shows a schematic diagram of an exemplary design of a first-order real pole section 230, which may be used for each of first-order sections 230a and 230b in FIGS. 2A and 2B. In this exemplary design, first-order section 230 implements a trans-impedance amplifier (TIA) that receives a current input signal and provides a voltage output signal. Within first-order section 230, a variable capacitor 414 with a value of C and a variable resistor 416 with a value of R are coupled in parallel, and the combination is coupled between an inverting input and an output of an op-amp 410. The non-inverting input of op-amp 410 may be coupled to circuit ground or a common mode voltage.

First-order section 230 can provide a first-order lowpass transfer function $H_1(s)$ in the s-domain. The transfer function $H_1(s)$ may be expressed as:

$$H_1(s) = \frac{R}{1 + \frac{s}{R \cdot C}}. \qquad \text{Eq (2)}$$

As shown in equation (2), the bandwidth of first-order section 230 is determined by the values of capacitor 414 and resistor 416 and may be adjusted by varying the value of capacitor 414 and/or the value of resistor 416.

Figure 4B:
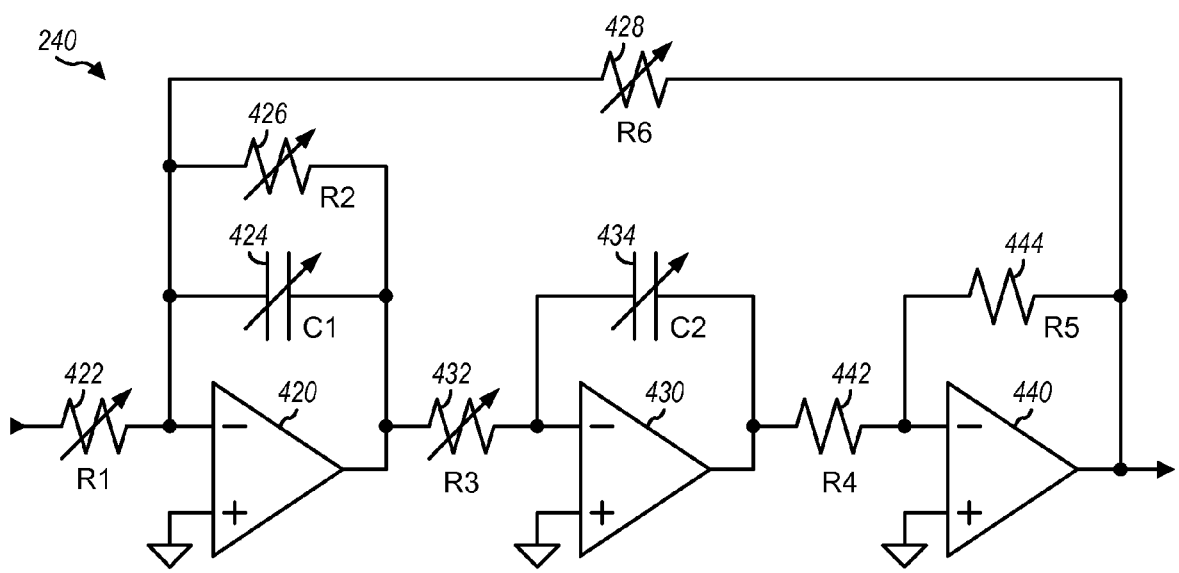
FIG. 4B shows a schematic diagram of a second-order biquad section.

FIG. 4B shows a schematic diagram of an exemplary design of a second-order biquad section 240, which may be used for each of biquad sections 240a, 242a, 240b and 242b in FIGS. 2A and 2B. Within biquad section 240, a variable resistor 422 with a value of R1 is coupled between an input of biquad section 240 and an inverting input of an op-amp 420. A variable capacitor 424 with a value of C1 and a variable resistor 426 with a value of R2 are coupled in parallel, and the combination is coupled between the inverting input and an output of op-amp 420. A variable resistor 432 with a value of R3 is coupled between the output of op-amp 420 and an inverting input of an op-amp 430. A variable capacitor 434 with a value of C2 is coupled between the inverting input and an output of op-amp 430. A resistor 442 with a value of R4 is coupled between the output of op-amp 430 and an inverting input of an op-amp 440. A resistor 444 with a value of R5 is coupled between the inverting input and an output of op-amp 440, which is also an output of biquad section 240. A variable resistor 428 with a value of R6 is coupled between the inverting input of op-amp 420 and the output of op-amp 440. Op-amp 440 provides signal inversion and may be omitted for a differential design.

Biquad section 240 can provide a second-order lowpass transfer function $H_2(s)$ in the s-domain. The transfer function $H_2(s)$ may be expressed as:

$$H(s) = \frac{G \cdot \omega_0^2}{s^2 + \frac{\omega_0}{Q}s + \omega_0^2}, \qquad \text{Eq (3)}$$

where $$\omega_0 = \frac{1}{\sqrt{R3 \cdot R6 \cdot C1 \cdot C2}} \text{ is the natural frequency,} \qquad \text{Eq (4)}$$

$$Q = \sqrt{\frac{R2^2 \cdot C1}{R3 \cdot R6 \cdot C2}} \text{ is the quality factor, and} \qquad \text{Eq (5)}$$

$$G = -\frac{R6}{R1} \text{ is the gain of the biquad section.} \qquad \text{Eq (6)}$$

The quality factor (Q) of biquad section 240 is determined by R2, R3, R6, C1 and C2. The bandwidth (BW) of the biquad section may be approximated as BW=$\omega_0$/Q. The filter bandwidth may be adjusted by varying C1 and/or C2. The filter bandwidth may also be varied by equally scaling R1, R2, R3 and R6 either up or down. For example, if R1, R2, R3 and R6 are 10 kilo-ohms (KΩ) and the bandwidth is 10 MHz, then a 5 MHz bandwidth may be obtained by changing R1, R2, R3 and R6 to 20 KΩ. The DC gain of the biquad section is determined by the ratio of R6 to R1, as shown in equation (6). The filter gain may be adjusted by varying R1, which affects only the filter gain and not the natural frequency or the quality factor of the biquad section, as shown in equations (3) to (6).

FIGS. 4A and 4B show exemplary designs of first-order real pole section 230 and second-order biquad section 240, respectively. First-order and second-order filter sections may also be implemented with other topologies. For example, a second-order filter section may be implemented with a voltage-controlled voltage source (VCVS) topology, an infinite gain multi-feedback topology, etc.

FIGS. 2A, 2B, 4A and 4B show exemplary single-ended designs of lowpass filters 220, first-order section 230, biquad section 240, and amplifiers 250, which receive single-ended input signals and provide single-ended output signals. Lowpass filters 220, first-order section 230, biquad section 240, and amplifiers 250 may also be implemented with differential designs and may receive differential input signals and provide differential output signals.

Lowpass filters 220a and 220b in FIGS. 2A and 2B may be operated in a normal mode or a closed-loop tuning mode, which may also be referred to as an in-situ tuning mode. The normal mode may be used for normal operation. In this mode, lowpass filters 220a and 220b filter the I and Q downconverted signals from mixers 210a and 210b, respectively. Each signal path may be configured for the normal mode by closing switch 212 and opening switches 258, 262 and 264.

The closed-loop tuning mode may be used to individually adjust the bandwidth and/or gain of lowpass filters 220a and 220b and/or the gain of amplifiers 250a and 250b in order to reduce phase and/or gain mismatches between the I and Q signal paths. Each signal path may be configured for the closed-loop tuning mode by opening switch 212 and closing switches 258, 262 and 264. In the closed-loop tuning mode, lowpass filter 220 and amplifier 250 for each signal path operate as an oscillator.

The closed-loop tuning mode may be used to individually adjust the bandwidth of lowpass filters 220a and 220b, which may also be referred to as bandwidth tuning, bandwidth adjustment, bandwidth calibration, etc. It can be shown that the 3 decibel (dB) bandwidth of each lowpass filter 220 is related to (i.e., correlated with) the oscillation frequency of the oscillator containing that lowpass filter. The relationship between oscillation frequency and filter bandwidth may be determined via computer simulation, lab measurement, etc., and may be stored in a look-up table that is accessible to or located within bandwidth control circuit 280. For each signal path, the bandwidth of lowpass filter 220 may be tuned by operating the lowpass filter in the closed-loop tuning mode, measuring the oscillation frequency, and adjusting variable capacitors and/or resistors within the lowpass filter to obtain a target oscillation frequency that corresponds to the desired filter bandwidth. This target oscillation frequency may be determined from the look-up table.

Lowpass filter 220a in the I signal path and lowpass filter 220b in the Q signal path may be individually tuned to have similar oscillation frequency in the closed-loop tuning mode. The bandwidth of lowpass filter 220a may then closely match the bandwidth of lowpass filter 220b. This may reduce phase mismatch between the I and Q signal paths, which may in turn reduce residual sideband.

The closed-loop tuning mode may also be used for several types of gain adjustments for the I and Q signal paths. First, gain adjustment may be performed to obtain the desired gain for lowpass filter 220 and/or amplifier 250 in each signal path, to obtain a target signal amplitude for lowpass filter 220 and/or amplifier 250 in each signal path, etc. This may then reduce gain mismatch between the I and Q signal paths. Second, gain adjustment may be performed to obtain the desired amplitude for an oscillator signal (e.g., at the output of amplifier 250) for each signal path in the closed-loop tuning mode. The accuracy of bandwidth tuning may be dependent on the correlation between oscillation frequency and filter bandwidth. The oscillation frequency may be dependent on various factors, with power supply voltage being one of the dominating factors.

Figure 5A:
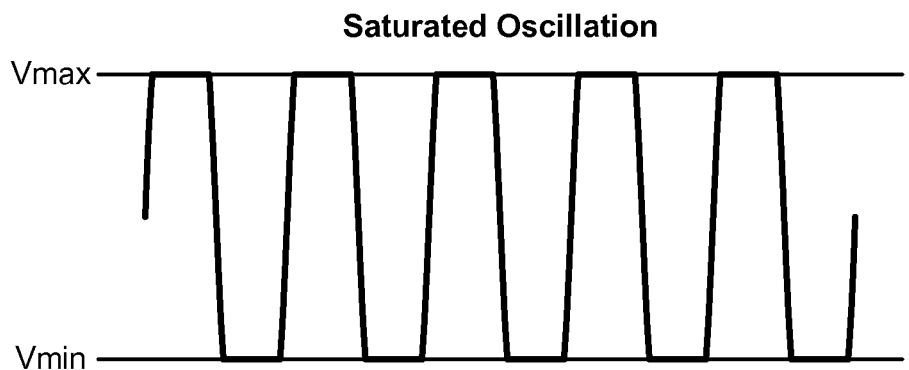
FIG. 5A shows a waveform with saturated oscillation.

FIG. 5A shows a waveform with saturated oscillation. When lowpass filter 220 for a given signal path is operated in the closed-loop tuning mode and the closed-loop gain is too large, the oscillator signal (e.g., at the output of amplifier 250) may have rail-to-rail signal swing and may be clipped at both a maximum voltage (Vmax) and a minimum voltage (Vmin), as shown in FIG. 5A. Vmax may be equal to an upper supply voltage Vdd, and Vmin may be equal to a lower supply voltage Vss, which may be circuit ground.

Figure 5B:
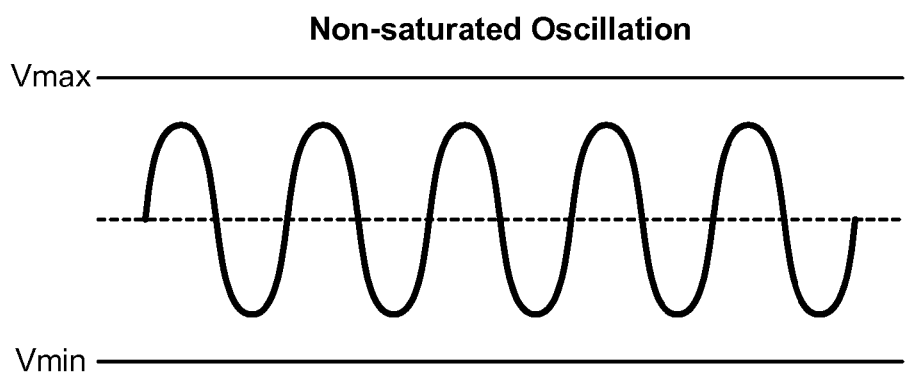
FIG. 5B shows a waveform with non-saturated oscillation.

FIG. 5B shows a waveform with non-saturated oscillation. When lowpass filter 220 for a given signal path is operated in the closed-loop tuning mode and the closed-loop gain is properly set, the oscillator signal may have a signal swing that is within the maximum and minimum voltages, as shown in FIG. 5B.

Table 1 lists four filter bandwidths and gives non-saturated oscillation frequency as well as saturated oscillation frequency corresponding to each filter bandwidth, for an exemplary design. Table 1 also gives the percentage difference between the non-saturated oscillation frequency and the saturated oscillation frequency for each filter bandwidth.

TABLE 1

| Filter Bandwidth | Non-saturated Oscillation Frequency | Saturated Oscillation Frequency | Percentage Difference |
| --- | --- | --- | --- |
| 2.8 MHz | 2.57 MHz | 2.08 MHz | 80.9% |
| 5.6 MHz | 5.04 MHz | 4.10 MHz | 81.4% |
| 11.2 MHz | 8.40 MHz | 6.90 MHz | 82.1% |
| 22.4 MHz | 14.5 MHz | 12.3 MHz | 84.8% |

The filter bandwidth may correlate better with the non-saturated oscillation frequency than the saturated oscillation frequency. The relationship between oscillation frequency and filter bandwidth may thus be determined for non rail-to-rail signal swing, which may be applicable under normal operation. Gain adjustment may be performed for each signal path to obtain a target amplitude and/or non rail-to-rail signal swing for the oscillator signal in that signal path. This may improve bandwidth tuning accuracy.

Figure 6:
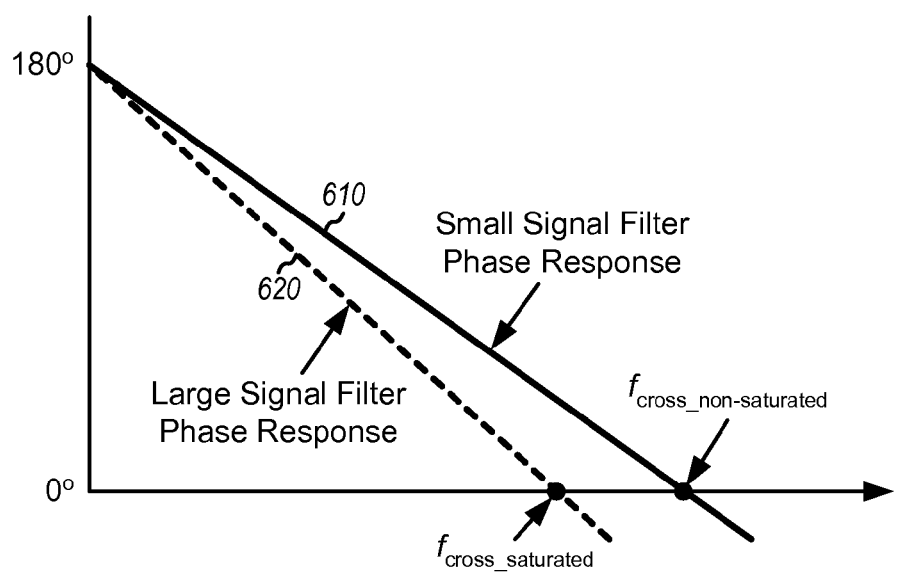
FIG. 6 shows plots of phase versus frequency for a generic filter.

FIG. 6 shows plots of phase response versus frequency for a generic filter. When the filter is configured as an oscillator, its oscillation frequency may be strongly correlated to (or proportional with a factor $\alpha_1$ to) the zero crossing frequency of a small signal phase response, which is shown by a solid line 610. This zero crossing frequency may also be strongly correlated to (or proportional with a factor $\alpha_2$ to) the 3 dB bandwidth of the filter. However, these relationships (or the factors $\alpha_1$ and $\alpha_2$) may be more valid when the filter is not saturated and works in small signal operation. Saturation results from excessive loop gain, which causes the oscillator to work in large signal operation so that the phase response is now changed to a dashed line 620. Saturation may result in factors $\alpha_1$ and $\alpha_2$ being less valid. Also, saturated operation may be more susceptible to supply voltage variations while non-saturated operation may be more immune to these variations.

Referring back to FIG. 2A, an oscillator may be formed by lowpass filter 220, amplifier 250, and variable resistor 260 for each signal path in the closed-loop tuning mode. For each signal path, a gain control loop may be formed with gain control circuit 270 and at least one variable gain element. The gain control loop may adjust the gain of the variable gain element(s) to obtain the desired gain and/or the desired signal amplitude. The variable gain element(s) may include variable resistor 260, one or more variable resistors within lowpass filter 220, and/or one or more variable resistors within amplifier 250. In general, the variable gain element(s) may comprise variable resistors (as shown in FIG. 2A), variable capacitors, programmable gain amplifiers, and/or other circuit elements that can vary gain.

For each signal path, gain control circuit 270 may receive the oscillator signal from amplifier 250 (as shown in FIG. 2A) or a signal from another suitable point in the oscillator (e.g., the output of lowpass filter 220). Gain control circuit 270 may adjust the value(s) of the variable gain element(s) such that the amplitude of the oscillator signal is maintained at a desired level.

In one exemplary design, gain control circuit 270 adjusts a single variable gain element (e.g., variable resistor 260) in the closed-loop tuning mode. In another exemplary design, gain control circuit 270 may adjust one or more variable gain elements in each circuit block being adjusted. For lowpass filter 220, gain control circuit 270 may adjust the gain of first-order section 230, with biquad sections 240 and 242 disabled/bypassed. Gain control circuit 270 may then adjust the gain of biquad section 240, with first-order section 230 enabled and biquad section 242 disabled. Gain control circuit 270 may then adjust the gain of biquad section 242, with all three filter sections 230, 240 and 242 enabled. Each filter section may then operate with the desired gain. For amplifier 250, gain control circuit 270 may adjust variable resistor 254 and/or 256 to obtain the desired gain for amplifier 250.

Figure 7:
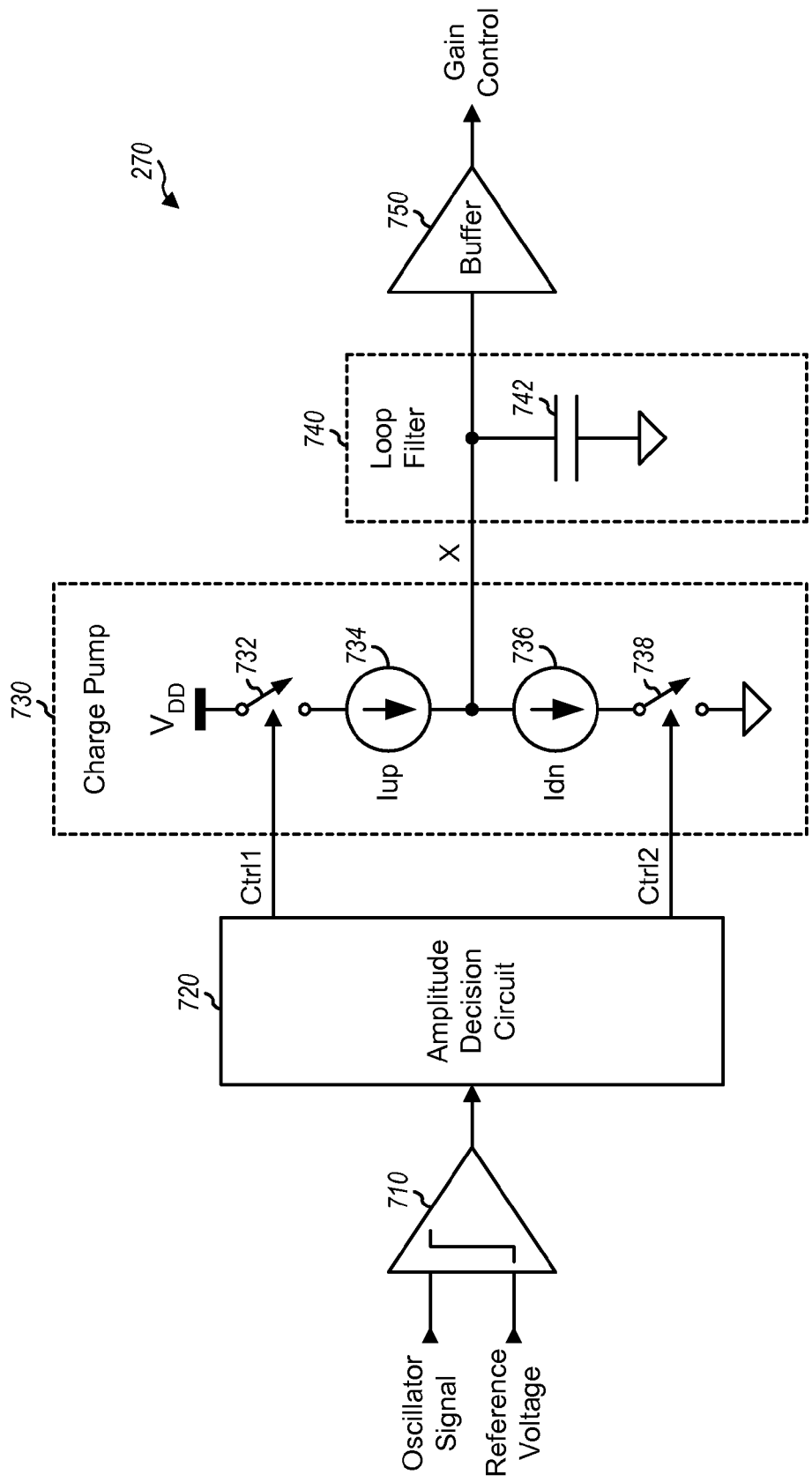
FIG. 7 shows a block diagram of a gain control circuit.

FIG. 7 shows a block diagram of an exemplary design of a gain control circuit 270, which may be used for each of gain control circuits 270a and 270b in FIG. 2A.

Figure 8:
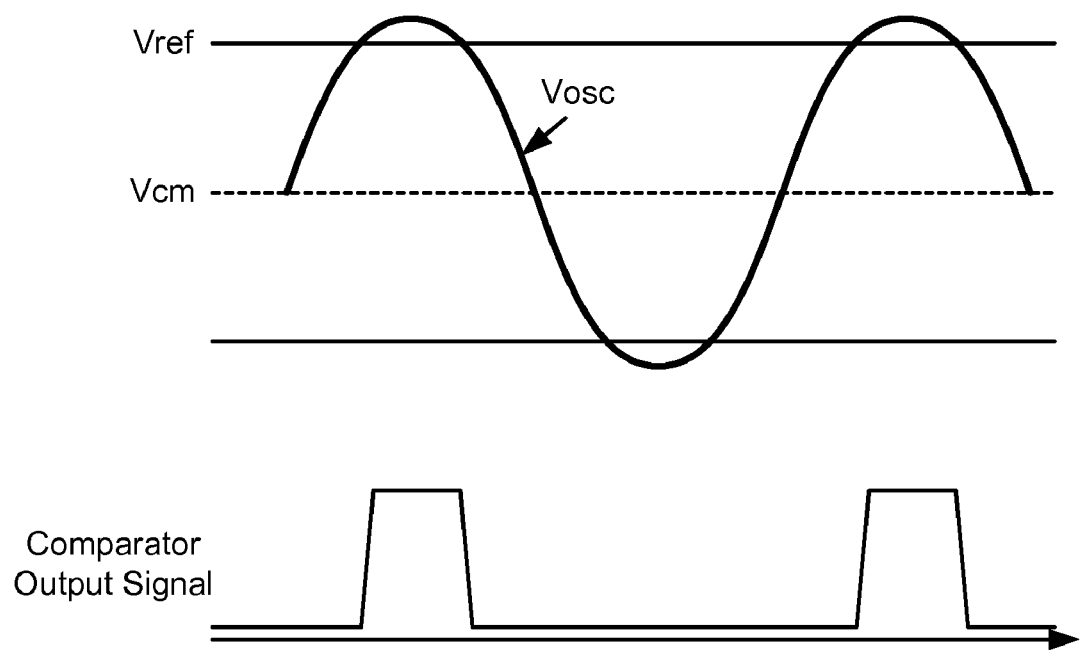
FIG. 8 shows a timing diagram of a comparator detecting oscillator signal swing.

Within gain control circuit 270, a comparator 710 receives an oscillator signal from amplifier 250 at a first input and a reference voltage (Vref) at a second input. The reference voltage determines the target amplitude of the oscillator signal and may be set to a suitable value to obtain the desired amplitude for the oscillator signal. Comparator 710 compares the oscillator signal against the reference voltage and provides a comparator output, which indicates whether the oscillator signal is larger or smaller than the reference voltage. FIG. 8 shows a timing diagram of the operation of comparator 710 in FIG. 7.

Comparator 710 may compare the oscillator signal against Vref, which may be either (i) Va higher than a common mode voltage Vcm of the oscillator signal (as shown in FIG. 8) or (ii) Va lower than Vcm (not shown in FIG. 8). Va determines the target amplitude of the oscillator signal. If the oscillator signal swing is higher than Vref, then comparator 710 provides a high pulse. A single comparator may be used to detect for oscillator signal swing above Vref, as shown in FIG. 8. Alternatively, one comparator may be used to detect for oscillator signal swing above Vref_high (which may be equal to Vcm plus Va), and another comparator may be used to detect for oscillator signal swing below Vref_low (which may be equal to Vcm minus Va).

Referring back to FIG. 7, an amplitude decision circuit 720 receives the comparator output and generates two control signals—a first control signal (Ctrl1) that is asserted if the oscillator signal amplitude is too small and a second control signal (Ctrl2) that is asserted if the oscillator signal amplitude is too large. In general, the logic levels of the first and second control signals may be dependent on how variable resistors and/or other circuit blocks are implemented.

Within a charge pump 730, a switch 732 and a current source 734 are coupled in series and between node X and a power supply voltage $V_{DD}$ (as shown in FIG. 7) or a voltage from a regulator (not shown in FIG. 7). A current source 736 and a switch 738 are coupled in series and between node X and circuit ground. Switch 732 is opened or closed by the Ctrl1 signal, and switch 738 is opened or closed by the Ctrl2 signal.

Within a loop filter 740, a capacitor 742 is coupled between node X and circuit ground.

A buffer 750 has its input coupled to node X and its output providing a gain control signal.

Gain control circuit 270 operates as follows. Comparator 710 is an amplitude detection circuit that determines whether the oscillator signal is larger or smaller than the target amplitude. Circuit 720 generates control signals to either increase or decrease a control voltage at node X based on the comparator output signal. Charge pump 730 provides a charging current (Iup) via current source 734 when switch 732 is closed, which would increase the control voltage. Charge pump 730 provides a discharging current (Idn) via current source 736 when switch 738 is closed, which would decrease the control voltage. Capacitor 742 within loop filter 740 averages the charging and discharging currents from charge pump 730. The size of capacitor 740 may be selected to provide the desired amount of averaging. Buffer 750 buffers the control voltage at node X and provides the gain control signal.

FIG. 7 shows an exemplary analog design of gain control circuit 270, which generates an analog gain control signal. This analog gain control signal may be used to adjust the gain of lowpass filter 220, amplifier 250, and/or variable resistor 260 in the I or Q signal path in FIG. 2A or 2B. Gain control circuit 270 may also be implemented with digital circuits or a combination of analog and digital circuits. In one exemplary digital design, the Ctrl1 signal from circuit 720 may be provided to a digital loop filter, which may be implemented with a digital accumulator or an up/down counter. The digital loop filter may filter the Ctrl1 signal and provide a digital gain control signal having sufficient resolution. The digital gain control signal may be used directly to adjust one or more variable resistors. Alternatively, the digital gain control signal may be converted to an analog control signal with a digital-to-analog converter (DAC), and the analog control signal may be used to adjust one or more variable resistors. The digital or analog control signal may also be used to control one or more programmable gain amplifiers or other variable gain elements.

Gain control circuit 270 may be enabled in the closed-loop tuning mode and may generate the gain control signal that can provide the desired gain for at least one variable gain element within the oscillator for the I or Q signal path. Gain control circuit 270 may be disabled in the normal mode. If the variable gain element(s) are used in the normal mode, then the control voltage that provides the desired value for the variable gain element(s) may be stored, e.g., with a capacitor or a digital storage element. The stored control voltage may then be applied to the variable gain element(s) in the normal mode.

Referring back to FIG. 2A, bandwidth control circuit 280 may individually adjust the bandwidth of lowpass filters 220a and 220b in the closed-loop tuning mode.

In one exemplary design, bandwidth control circuit 280 may adjust the overall bandwidth of each lowpass filter 220. In another exemplary design, bandwidth control circuit 280 may adjust the bandwidth of one or more filter sections for each lowpass filter 220. For example, bandwidth control circuit 280 may adjust the bandwidth of first-order section 230, the bandwidth of biquad section 240, and/or the bandwidth of biquad section 242 in each lowpass filter 220. The overall frequency response of each lowpass filter 220 may be obtained by superposition of the frequency responses of filter sections 230, 240 and 242. By tuning the frequency responses of the individual filter sections 230, 240 and/or 242, a more accurate overall frequency response for lowpass filter 220 may be obtained. In yet another exemplary design, bandwidth control circuit 280 may adjust the bandwidth of one or more filter sections selected for use in each lowpass filter 220. Lowpass filters 220a and 220b may be operated as first-order lowpass filters, third-order lowpass filters, or fifth-order lowpass filters, e.g., based on system requirements and/or other factors. In general, bandwidth adjustment may be performed for each filter section or all filter sections selected for use.

Figure 9:
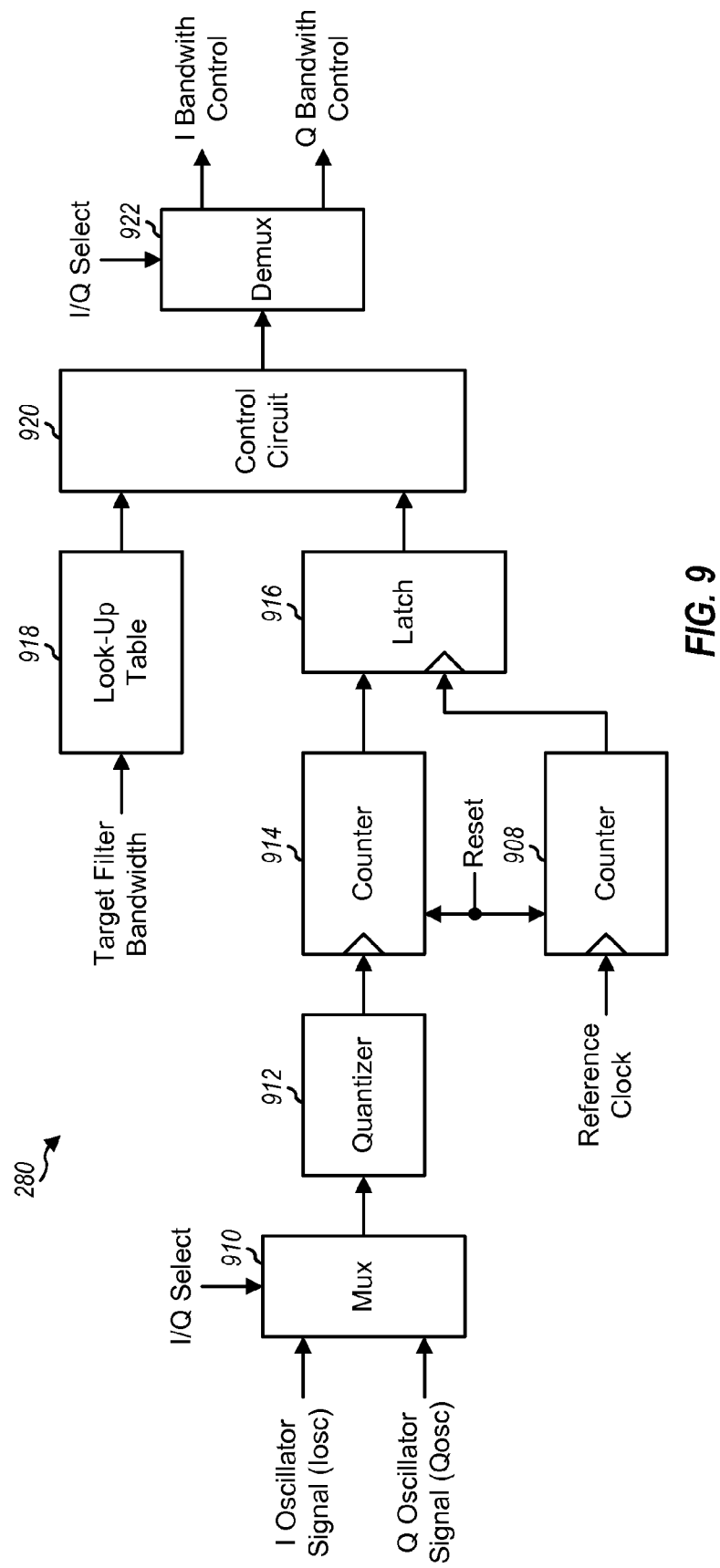
FIG. 9 shows a block diagram of a bandwidth control circuit.

FIG. 9 shows a block diagram of an exemplary design of bandwidth control circuit 280. Within bandwidth control circuit 280, a counter 908 receives a reference clock and a reset signal, resets to zero when the reset signal is active, counts $N_{ref}$ cycles of the reference clock when the reset signal is inactive, and provides a trigger signal. $N_{ref}$ may be any suitable value. The active transition in the trigger signal is delayed by a predetermined time duration from the active transition in the reset signal. The reference clock may have a precise frequency, and the predetermined time duration may be relatively accurate and dependent on the number of reference clock cycles ($N_{ref}$) being counted.

A multiplexer (Mux) 910 receives the I oscillator signal (Iosc) from amplifier 250a in the I signal path and the Q oscillator signal (Qosc) from amplifier 250b in the Q signal path. Multiplexer 910 provides either the I or Q oscillator signal based on an I/Q select signal. A quantizer 912 quantizes the oscillator signal from multiplexer 910. A counter 914 receives the quantized oscillator signal and the reset signal, resets to zero when the reset signal is active, and increments by one for each oscillator signal cycle. A latch 916 latches a count value from counter 914 when enabled by the trigger signal from counter 908. The latched count value is indicative of the frequency of the oscillator signal, which may be expressed as:

$$f_{osc} = \frac{N_{osc}}{N_{ref}} \cdot f_{ref}, \qquad \text{Eq (7)}$$

where $N_{osc}$ is the latched count value, $f_{ref}$ is the frequency of the reference clock, and $f_{osc}$ is the frequency of the oscillator signal. As shown in equation (7), the oscillation frequency $f_{osc}$ is proportional to the latched counter value $N_{osc}$.

A look-up table 918 stores a table of oscillation frequency versus filter bandwidth, e.g., a target count value for each filter bandwidth. The table may be determined based on computer simulation, lab measurement, etc. A target filter bandwidth may be provided to look-up table 918, which may provide a target oscillation frequency (e.g., a target count value) corresponding to the target filter bandwidth. A control circuit 920 receives the target count value from look-up table 918 and the latched count value from latch 916. Control circuit 920 compares the two received count values and determines a bandwidth control, which may indicate whether to increase or decrease the oscillation frequency and how much to increase or decrease the oscillation frequency. Control circuit 920 may perform (i) a linear search and increase or decrease the oscillation frequency by a fixed step or (ii) a binary search and increase or decrease the oscillation frequency by progressively smaller steps. A demultiplexer (Demux) 922 receives the bandwidth control from control circuit 920 and, based on the I/Q select signal, provides this bandwidth control as either the I bandwidth control to lowpass filter 220a in the I signal path or the Q bandwidth control to lowpass filter 220b in the Q signal path.

Referring back to FIG. 2A, the I bandwidth control may vary all capacitors within lowpass filter 220a. Similarly, the Q bandwidth control may vary all capacitors within lowpass filter 220b. The bandwidth tuning for each lowpass filter 220 may be performed in an iterative manner (e.g., by measuring the oscillation frequency, adjusting the capacitors in the lowpass filter, and repeating the process) until the oscillation frequency is as close as possible to the target oscillation frequency.

As noted above, the amplitude of an oscillator signal may affect the oscillation frequency. Hence, gain adjustment may be performed first to obtain a target amplitude for the oscillator signal. Bandwidth adjustment may then be performed with the oscillator signal set to the target amplitude.

Variable resistors and variable capacitors used for gain and bandwidth tuning may be implemented in various manners. A variable resistor may be continuously adjustable or adjustable in discrete step. Similarly, a variable capacitor may be continuously adjustable or adjustable in discrete step.

Figure 10:
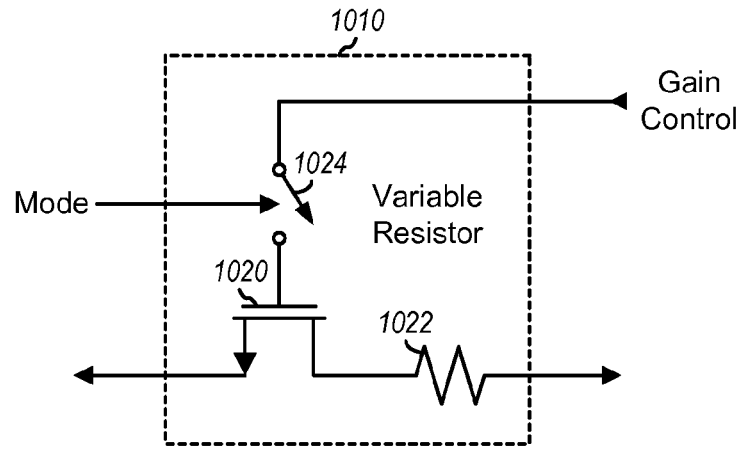
FIG. 10 shows a schematic diagram of a variable resistor.

FIG. 10 shows a schematic diagram of an exemplary design of a variable resistor 1010, which may be used for each of variable resistors 254, 256 and 260 in FIGS. 2A and 2B, and variable resistors 422 to 434 in FIG. 4B. Within variable resistor 1010, an N-channel metal oxide semiconductor (NMOS) transistor 1020 has its gate coupled to one end of a switch 1024, its drain coupled to one end of a resistor 1022, and its source forming one end of variable resistor 1010. The other end of resistor 1022 forms the other end of variable resistor 1010. The other end of switch 1024 receives the gain control voltage from gain control circuit 270 in FIG. 7.

Variable resistor 1010 operates as follows. Switch 1024 may be closed by a mode select signal (Mode) to enable variable adjustment of the resistor value. When switch 1024 is closed, the gain control voltage is applied to the gate of NMOS transistor 1022, and the drain-to-source resistance (Rds) of NMOS transistor 1022 is inversely related to the gain control voltage. A smaller Rds value may be obtained with a higher gain control voltage, and vice versa. Gain control circuit 270 may vary the gain control voltage to obtain the desired resistor value for variable resistor 1010. Resistor 1022 provides a minimum resistor value for variable resistor 1010.

FIG. 10 shows an exemplary design of variable resistor 1010 using the Rds resistance of an NMOS transistor. A variable resistor may also be implemented in other manners (e.g., with a P-channel MOS (PMOS) transistor instead of an NMOS transistor). A variable resistor may also have continuously variable resistance (e.g., as shown in FIG. 8) or programmable resistance in discrete steps.

Figure 11:
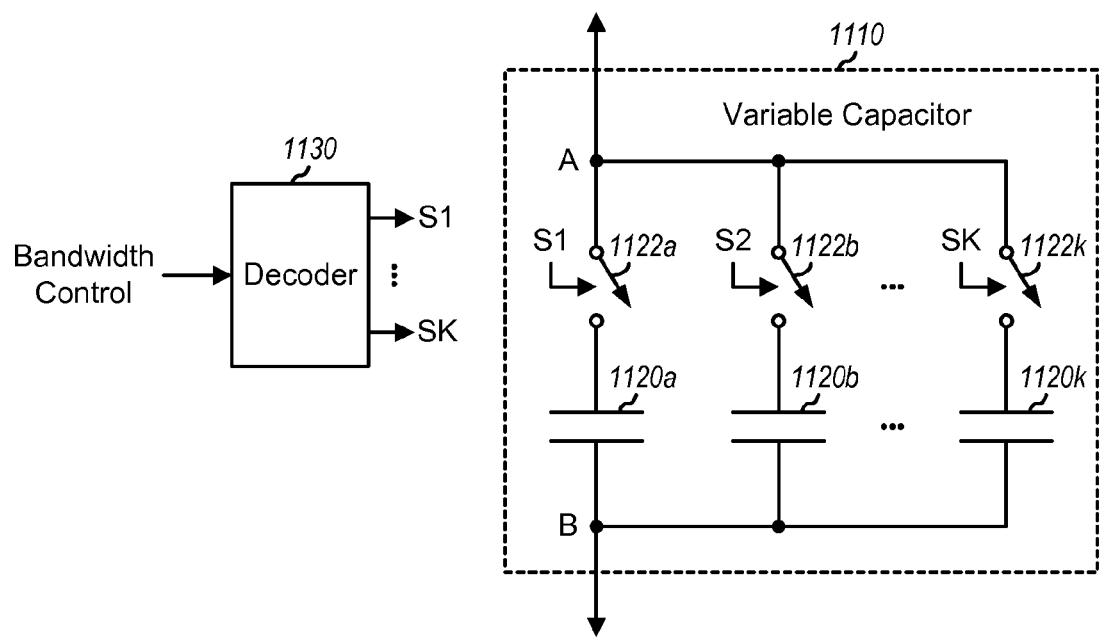
FIG. 11 shows a schematic diagram of a variable capacitor.

FIG. 11 shows a schematic diagram of an exemplary design of a variable capacitor 1110, which may be used for each of capacitor 414 in FIG. 4A and capacitors 424 and 434 in FIG. 4B. In the exemplary design shown in FIG. 11, variable capacitor 1110 is composed of K capacitors 1120a through 1120k coupled to K switches 1122a through 1122k, respectively, where K may be a suitable value. The K series combination of capacitor 1120 and switch 1122 are coupled in parallel between nodes A and B, which correspond to the two ends of variable capacitor 1110. Different capacitor values may be obtained by turning on different switches 1122 and selecting different capacitors 1120.

The K capacitors 1120a through 1120k may be implemented in various manners. In one exemplary design, capacitors 1120a through 1120k have values selected based on geometric progression. For example, capacitor 1120a may be 2% larger than capacitor 1120b, which may be 2% larger than the next capacitor, etc. In another exemplary design, capacitors 1120a through 1120k have binary weighted values, so that capacitor 1120a is two times larger than capacitor 1120b, which is two times larger than the next capacitor, etc. In yet another exemplary design, capacitors 1120a through 1120k are thermometer decoded and have unit capacitance. Adjustable capacitor 1110 may also be implemented with other topologies and/or may have other values.

A decoder 1130 receives a bandwidth control from bandwidth control circuit 280 and generates S1 through SK select signals for switches 1122a through 1122k, respectively. The particular switches to close may be dependent on the bandwidth control and the values of capacitors 1120a through 1120k. In one exemplary design, an 8-bit bandwidth control may select one of 256 possible capacitor values, which may cover a range of +25% to −25% of a nominal value for variable capacitor 1110. Other bit widths and/or capacitance ranges may also be implemented.

In one exemplary design, each variable capacitor may be implemented with a bank of K capacitors, e.g., as shown in FIG. 11. All variable capacitors in each lowpass filter 220 may be tuned in the same manner based on a single bandwidth control for that lowpass filter. The same set of capacitors may be selected for each variable capacitor based on the bandwidth control. In another exemplary design, each variable capacitor may be individually tuned based on a separate bandwidth control for that variable capacitor. In general, one or more variable capacitors may be tuned together based on a common bandwidth control.

In an exemplary design, an apparatus may include first and second filters and a bandwidth control circuit. The first filter may operate as part of a first oscillator in a first mode (e.g., the closed-loop tuning mode) and may filter a first input signal and provide a first output signal in a second mode (e.g., the normal mode). The second filter may operate as part of a second oscillator in the first mode and may filter a second input signal and provide a second output signal in the second mode. A set of switches (e.g., switches 212a, 212b, 258a and 258b in FIG. 2A) may be used to select the first mode or the second mode.

The bandwidth control circuit may adjust the bandwidth of the first and second filters in the first mode. The bandwidth control circuit may adjust the oscillation frequency of the first oscillator to obtain a target bandwidth for the first filter and may adjust the oscillation frequency of the second oscillator to obtain the target bandwidth for the second filter. In one exemplary design, the bandwidth control circuit may comprise a counter, a look-up table, and a control circuit, e.g., as shown in FIG. 9. The counter may count the number of cycles of an oscillator signal from an oscillator and provide a count value. The look-up table may store target oscillation frequencies (e.g., target count values) for a set of filter bandwidths. The control circuit may determine the oscillation frequency of the oscillator based on the count value and may generate a bandwidth control to adjust the oscillation frequency based on the measured oscillation frequency and the target oscillation frequency for the target bandwidth.

The first and second filters may each comprise multiple filter sections coupled in series, with each filter section implementing a first, second, or higher order. The bandwidth control circuit may adjust the oscillation frequency of each oscillator to obtain the target bandwidth for the corresponding filter, with the multiple filter sections enabled. Alternatively, the bandwidth control circuit may individually adjust the bandwidth of each tunable filter section in each filter.

The apparatus may further include first and second gain control circuits. The first gain control circuit may vary the amplitude of a first oscillator signal from the first oscillator and/or may set a gain of the first filter in the first mode. The second gain control circuit may vary the amplitude of a second oscillator signal from the second oscillator and/or may set a gain of the second filter in the first mode. The first gain control circuit may set the amplitude of the first oscillator signal prior to bandwidth adjustment of the first filter. The second gain control circuit may set the amplitude of the second oscillator signal prior to bandwidth adjustment of the second filter. Each gain control circuit may adjust at least one variable gain element within an associated oscillator to obtain a target amplitude, or non rail-to-rail signal swing, or both for an oscillator signal. Each gain control circuit may include a comparator, a loop filter, and possibly other circuits, e.g., as shown in FIG. 7. The comparator may compare the oscillator signal against a reference value and provide a comparator output. The reference value may determine the target amplitude for the oscillator signal. The loop filter may generate a gain control for the at least one variable gain element in the oscillator based on the comparator output.

Figure 12:
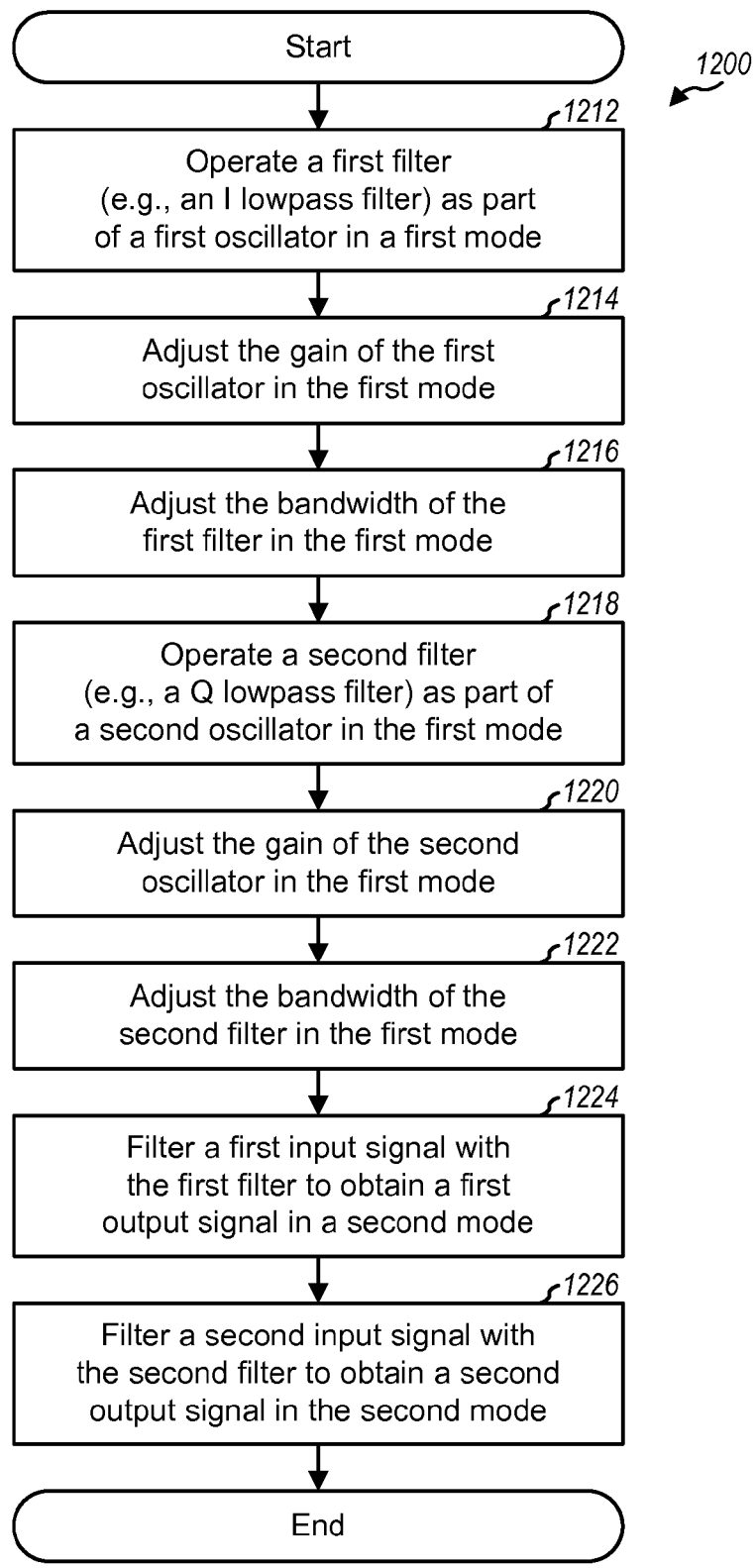
FIG. 12 shows a process for operating tunable filters.

FIG. 12 shows an exemplary design of a process 1200 for operating tunable filters. A first filter (e.g., for the I signal path) may be operated as part of a first oscillator in a first mode (block 1212). The gain of the first oscillator may be adjusted in the first mode (block 1214). The bandwidth of the first filter may be adjusted in the first mode, e.g., after gain adjustment, by adjusting the oscillation frequency of the first oscillator to obtain a target bandwidth for the first filter (block 1216). The gain and bandwidth of the first filter may be stored for use during normal operation. A second filter (e.g., for the Q signal path) may be operated as part of a second oscillator in the first mode (block 1218). The gain of the second oscillator may be adjusted in the second mode (block 1220). The bandwidth of the second filter may be adjusted in the first mode, e.g., after gain adjustment, by adjusting the oscillation frequency of the second oscillator to obtain the target bandwidth for the second filter (block 1222). The gain and bandwidth of the second filter may also be stored for use during normal operation.

In one exemplary design of block 1216, the oscillation frequency of the first oscillator may be measured, e.g., with a counter. A target oscillation frequency for the target bandwidth may be determined, e.g., from a table of target oscillation frequency versus filter bandwidth. The oscillation frequency of the first oscillator may be adjusted based on the measured oscillation frequency and the target oscillation frequency. The bandwidth adjustment in block 1222 may be performed in similar manner as block 1216. The bandwidth of each filter may be adjusted with all filter sections enabled. The bandwidth adjustment may also be performed individually for each filter section or for a combination of filter sections.

A first input signal may be filtered with the first filter to obtain a first output signal in a second mode (block 1224). A second input signal may be filtered with the second filter to obtain a second output signal in the second mode (block 1226). The first and second input signals may be I and Q downconverted signals, respectively.

The tunable filters described herein may be implemented on an IC, an analog IC, an RFIC, a mixed-signal IC, an application specific integrated circuit (ASIC), a printed circuit board (PCB), an electronics device, etc. The tunable filters may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the tunable filters described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first filter to operate as part of a first oscillator in a first mode and to filter a first input signal and provide a first output signal in a second mode;
   a second filter to operate as part of a second oscillator in the first mode and to filter a second input signal and provide a second output signal in the second mode; and
   a bandwidth control circuit to adjust and match bandwidths of the first and second filters in the first mode.

2. The apparatus of claim 1, the bandwidth control circuit adjusting oscillation frequency of the first oscillator to obtain a target bandwidth for the first filter and adjusting oscillation frequency of the second oscillator to obtain the target bandwidth for the second filter.

3. The apparatus of claim 2, the bandwidth control circuit comprising
   a counter to count the number of cycles of an oscillator signal from the first or second oscillator and to provide a count value, and
   a control circuit to determine the oscillation frequency of the first or second oscillator based on the count value.

4. The apparatus of claim 3, the bandwidth control circuit further comprising
   a look-up table to store target oscillation frequencies for a set of filter bandwidths, and
   the control circuit generating a bandwidth control to adjust the oscillation frequency of the first or second oscillator based on the count value from the counter and a target oscillation frequency for the target bandwidth from the look-up table.

5. The apparatus of claim 1, the first and second filters each comprising multiple filter sections coupled in series.

6. The apparatus of claim 5, the bandwidth control circuit adjusting the oscillation frequency of each oscillator to obtain the target bandwidth for each filter with the multiple filter sections enabled.

7. The apparatus of claim 5, the bandwidth control circuit individually adjusting bandwidth of each of the multiple filter sections in each of the first and second filters.

8. The apparatus of claim 1, further comprising:
   a first gain control circuit to vary amplitude of a first oscillator signal from the first oscillator in the first mode; and
   a second gain control circuit to vary amplitude of a second oscillator signal from the second oscillator in the first mode.

9. The apparatus of claim 8, each of the first and second gain control circuits comprising
   a comparator to compare an oscillator signal from an oscillator against a reference value and to provide a comparator output, the reference value determining a target amplitude for the oscillator signal, and
   a loop filter to generate a gain control for at least one variable gain element in the oscillator based on the comparator output.

10. The apparatus of claim 8, the first gain control circuit varying the amplitude of the first oscillator signal prior to the bandwidth control circuit adjusting the bandwidth of the first filter, the second gain control circuit varying the amplitude of the second oscillator signal prior to the bandwidth control circuit adjusting the bandwidth of the second filter.

11. The apparatus of claim 8, the first gain control circuit adjusting at least one variable gain element within the first oscillator to obtain a target amplitude, or non rail-to-rail signal swing, or both for the first oscillator signal, and the second gain control circuit adjusting at least one variable gain element within the second oscillator to obtain the target amplitude, or non rail-to-rail signal swing, or both for the second oscillator signal.

12. The apparatus of claim 8, the first gain control circuit setting a gain of the first filter in the first mode, and the second gain control circuit setting a gain of the second filter in the first mode.

13. An integrated circuit comprising:
    a first filter to operate as part of a first oscillator in a first mode and to filter a first input signal and provide a first output signal in a second mode;
    a second filter to operate as part of a second oscillator in the first mode and to filter a second input signal and provide a second output signal in the second mode; and
    a bandwidth control circuit to adjust and match bandwidths of the first and second filters in the first mode.

14. The integrated circuit of claim 13, further comprising:
    a first gain control circuit to vary amplitude of a first oscillator signal from the first oscillator in the first mode; and
    a second gain control circuit to vary amplitude of a second oscillator signal from the second oscillator in the first mode.

15. A wireless device comprising:
    a first mixer to downconvert a received signal with an inphase (I) local oscillator (LO) signal and provide an I input signal;
    a second mixer to downconvert the received signal with a quadrature (Q) LO signal and provide a Q input signal;
    a first filter to operate as part of a first oscillator in a first mode and to filter the I input signal and provide an I output signal in a second mode;
    a second filter to operate as part of a second oscillator in the first mode and to filter the Q input signal and provide a Q output signal in the second mode; and
    a bandwidth control circuit to adjust and match bandwidths of the first and second filters in the first mode.

16. The wireless device of claim 15, further comprising:

a first gain control circuit to vary amplitude of a first oscillator signal from the first oscillator in the first mode; and a second gain control circuit to vary amplitude of a second oscillator signal from the second oscillator in the first mode.

17. A method comprising:

adjusting bandwidth of a first filter operating as part of a first oscillator in a first mode;

adjusting bandwidth of a second filter operating as part of a second oscillator in the first mode, the bandwidth of the first filter and the bandwidth of the second filter being matched;

filtering a first input signal with the first filter to obtain a first output signal in a second mode; and filtering a second input signal with the second filter to obtain a second output signal in the second mode.

18. The method of claim 17, the adjusting the bandwidth of the first filter comprising adjusting oscillation frequency of the first oscillator to obtain a target bandwidth for the first filter, and the adjusting the bandwidth of the second filter comprising adjusting oscillation frequency of the second oscillator to obtain the target bandwidth for the second filter.

19. The method of claim 18, the adjusting the oscillation frequency of the first oscillator comprising measuring oscillation frequency of the first oscillator, determining a target oscillation frequency for the target bandwidth, and adjusting the oscillation frequency of the first oscillator based on the measured oscillation frequency and the target oscillation frequency.

20. The method of claim 19, further comprising:

storing a table of target oscillation frequencies for a set of filter bandwidths, the target oscillation frequency for the target bandwidth being obtained from the table.

21. The method of claim 17, the adjusting the bandwidth of the first filter comprising individually adjusting bandwidth of each of multiple filter sections in the first filter, and the adjusting the bandwidth of the second filter comprising individually adjusting bandwidth of each of multiple filter sections in the second filter.

22. The method of claim 17, further comprising:

adjusting gain of the first oscillator in the first mode prior to adjusting the bandwidth of the first filter; and adjusting gain of the second oscillator in the first mode prior to adjusting the bandwidth of the second filter.

23. An apparatus comprising:

means for adjusting bandwidth of a first filter operating as part of a first oscillator in a first mode;

means for adjusting bandwidth of a second filter operating as part of a second oscillator in the first mode, the bandwidth of the first filter and the bandwidth of the second filter being matched;

means for filtering a first input signal with the first filter to obtain a first output signal in a second mode; and means for filtering a second input signal with the second filter to obtain a second output signal in the second mode.

24. The apparatus of claim 23, the means for adjusting the bandwidth of the first filter comprising means for adjusting oscillation frequency of the first oscillator to obtain a target bandwidth for the first filter, and the means for adjusting the bandwidth of the second filter comprising means for adjusting oscillation frequency of the second oscillator to obtain the target bandwidth for the second filter.

25. The apparatus of claim 24, the means for adjusting the oscillation frequency of the first oscillator comprising means for measuring oscillation frequency of the first oscillator, means for determining a target oscillation frequency for the target bandwidth, and means for adjusting the oscillation frequency of the first oscillator based on the measured oscillation frequency and the target oscillation frequency.

26. The apparatus of claim 23, further comprising:

means for adjusting gain of the first oscillator in the first mode prior to adjusting the bandwidth of the first filter; and means for adjusting gain of the second oscillator in the first mode prior to adjusting the bandwidth of the second filter.

* * * * *